(12) United States Patent
Jeng et al.

(10) Patent No.: US 11,810,830 B2
(45) Date of Patent: Nov. 7, 2023

(54) CHIP PACKAGE STRUCTURE WITH CAVITY IN INTERPOSER

(71) Applicant: Taiwan Semiconductor Manufacturing Company, Ltd., Hsinchu (TW)

(72) Inventors: Shin-Puu Jeng, Hsinchu (TW); Feng-Cheng Hsu, New Taipei (TW); Shuo-Mao Chen, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/814,874

(22) Filed: Jul. 26, 2022

(65) Prior Publication Data

US 2022/0359320 A1    Nov. 10, 2022

Related U.S. Application Data

(62) Division of application No. 16/984,382, filed on Aug. 4, 2020, now Pat. No. 11,443,993.

(60) Provisional application No. 62/897,460, filed on Sep. 9, 2019.

(51) Int. Cl.
*H01L 23/13* (2006.01)
*H01L 23/498* (2006.01)
(Continued)

(52) U.S. Cl.
CPC ........ *H01L 23/13* (2013.01); *H01L 23/49833* (2013.01); *H01L 23/5384* (2013.01);
(Continued)

(58) Field of Classification Search
CPC ............... H01L 23/13; H01L 23/49833; H01L 23/5384
See application file for complete search history.

(56) References Cited

U.S. PATENT DOCUMENTS 8,993,380 B2    3/2015   Hou et al.
9,281,254 B2    3/2016   Yu et al.
(Continued)

FOREIGN PATENT DOCUMENTS

TW    201715681 A    5/2017
TW    201906091 A    2/2019
TW    201919165 A    5/2019

OTHER PUBLICATIONS

Chinese language office action dated Oct. 26, 2020, issued in application No. TW 109130136.

*Primary Examiner* — Errol V Fernandes
(74) *Attorney, Agent, or Firm* — McClure, Qualey & Rodack, LLP

(57) ABSTRACT

A package structure and a method of forming the same are provided. The package structure includes a package substrate, an interposer substrate, a first semiconductor device, and a second semiconductor device. The interposer substrate is disposed over the package substrate and includes a silicon substrate. The interposer substrate has a bottom surface facing and adjacent to the package substrate, a top surface opposite the bottom surface, and a cavity formed on the top surface. The first semiconductor device is disposed on the top surface of the interposer substrate. The second semiconductor device is received in the cavity and electrically connected to the first semiconductor device and/or the interposer substrate.

20 Claims, 16 Drawing Sheets

(51) Int. Cl.
*H01L 23/538* (2006.01)
*H01L 23/00* (2006.01)
*H01L 25/00* (2006.01)
H01L 25/18 (2023.01)

(52) U.S. Cl.
CPC .......... *H01L 23/5385* (2013.01); *H01L 24/16* (2013.01); *H01L 24/17* (2013.01); *H01L 25/50* (2013.01); H01L 25/18 (2013.01); H01L 2224/16148 (2013.01); H01L 2224/16238 (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,640,498 B1 | 5/2017 | Huang et al. |
| 9,666,502 B2 | 5/2017 | Chen et al. |
| 9,735,131 B2 | 8/2017 | Su et al. |
| 10,304,800 B2 | 5/2019 | Chen et al. |
| 10,515,827 B2 | 12/2019 | Jeng et al. |
| 10,535,608 B1 * | 1/2020 | Rubin ................ H01L 24/17 |
| 2004/0184219 A1 | 9/2004 | Otsuka et al. |
| 2013/0181354 A1 * | 7/2013 | Khan ............... H01L 23/49833 257/774 |
| 2013/0271907 A1 | 10/2013 | Mortensen et al. |
| 2015/0348893 A1 | 12/2015 | Wang et al. |

* cited by examiner

CHIP PACKAGE STRUCTURE WITH CAVITY IN INTERPOSER

PRIORITY CLAIM AND CROSS-REFERENCE

The present application is a Divisional of U.S. application Ser. No. 16/984,382, filed on Aug. 4, 2020, now U.S. Pat. No. 11,443,993, which claims the benefit of U.S. Provisional Application No. 62/897,460, filed on Sep. 9, 2019, the entirety of which is incorporated by reference herein.

BACKGROUND

Integrated circuits (ICs) are made practical by technological advancements in semiconductor device fabrication. The size, speed, and capacity of chips have progressed enormously, driven by technical advances that fit more and more elements on chips of the same size. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

Although existing packaging techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
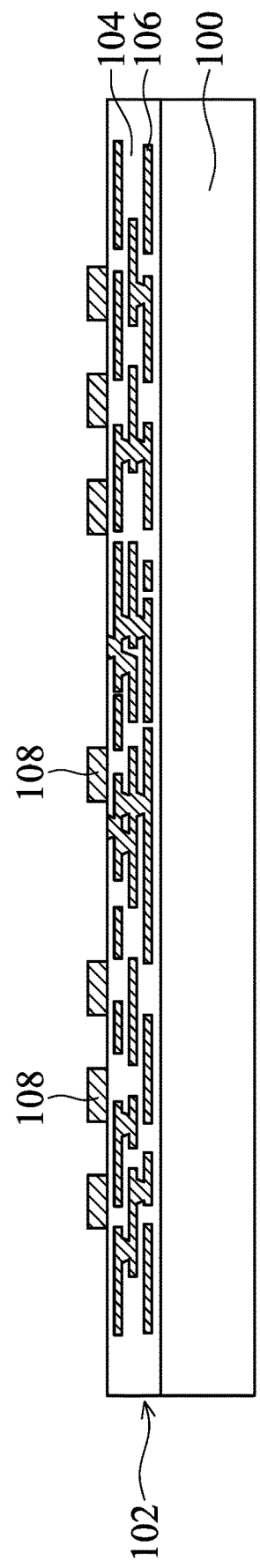
FIGS. 1A-1G are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

Embodiments of the disclosure may relate to 3D packaging (sometimes also called 2.5D packaging) or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are cross-sectional views of various stages of a process for forming a package structure, in accordance with some embodiments. As shown in FIG. 1A, a package substrate 102 is formed over a carrier substrate 100, in accordance with some embodiments. The carrier substrate 100 may be a glass substrate, semiconductor substrate, or another suitable substrate. The package substrate 102 may be used to provide electrical connection between the semiconductor devices (which will be described later) in the package structure and an external electronic device, after the carrier substrate 100 is removed at a subsequent stage (illustrated in FIG. 1E).

The package substrate 102 may be used for routing. In some embodiments, the package substrate 102 is a redistribution substrate. In some alternative embodiments, the package substrate 102 is a build-up substrate (e.g., a printed circuit board) including a core and build-up layers on opposing sides of the core. In the subsequent discussion of the embodiments of the present disclosure, a redistribution substrate is illustrated as an example of the package substrate 102, while the teaching revealed in accordance with the example embodiments are readily applicable for build-up substrates. The package substrate 102 includes multiple laminated insulating layers 104 and multiple conductive features 106 surrounded by the insulating layers 104, as shown in FIG. 1A. The conductive features 106 may include conductive lines, conductive vias, and/or conductive pads. In some embodiments, some of the conductive vias are stacked with each other. The upper conductive via is substantially aligned with the lower conductive via so as to have a shorter routing length. However, some of the conductive vias may be staggered vias in some cases with restricted routing. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the package substrate 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

As shown in FIG. 1A, the package substrate 102 also includes conductive elements 108 formed thereon, in accordance with some embodiments. Each conductive element 108 (such as a conductive pillar) may be exposed at or protruding from the topmost surface of the insulating layers 104, and may be electrically connected to one of the conductive features 106. The conductive elements 108 may be used to electrically coupled to, hold or receive conductive structures, which will be described later.

The conductive elements 108 may be made of or include copper, aluminum, gold, cobalt, titanium, tin, one or more other suitable materials, or a combination thereof. The conductive elements 108 may be formed using an electroplating process, an electroless plating process, a placement process, a printing process, a physical vapor deposition (PVD) process, a chemical vapor deposition (CVD) process, one or more other applicable processes, or a combination thereof.

Figure 1B:
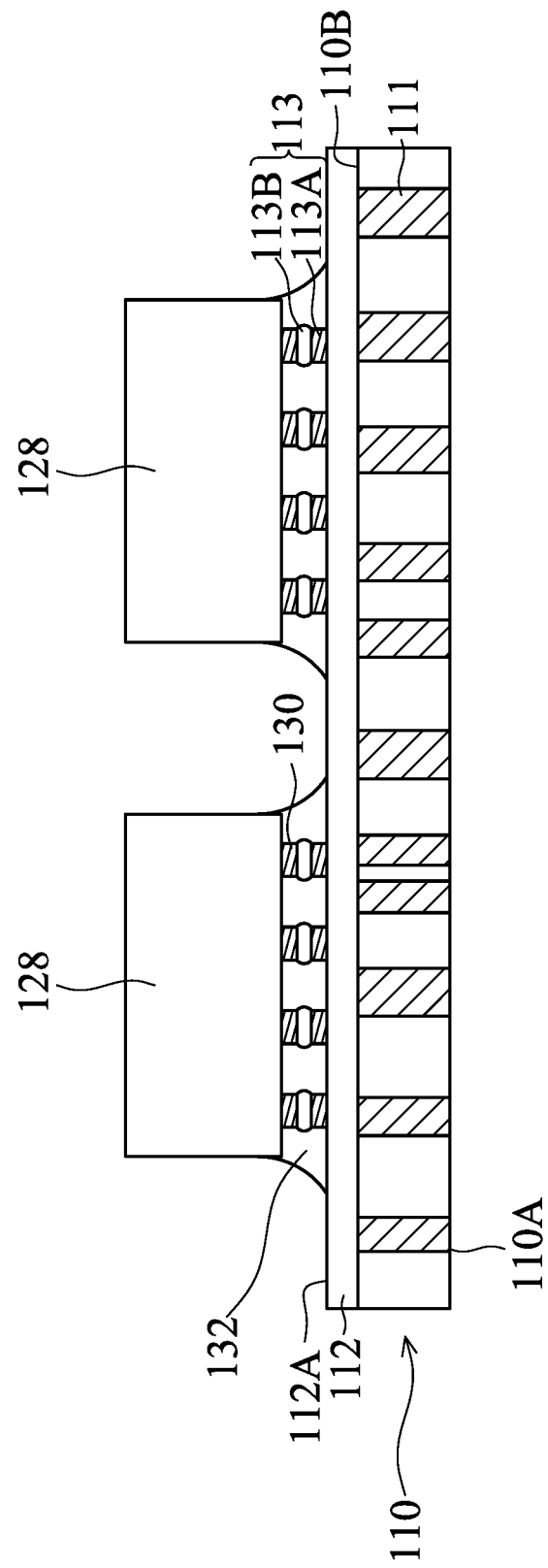

As shown in FIG. 1B, an interposer substrate 110 to be stacked over the package substrate 102 (see FIG. 1A) is provided, in accordance with some embodiments. In some embodiments, the interposer substrate 110 may be an interposer wafer, which is free from active devices (such as transistors and diodes) and passive devices (such as resistors, capacitors, inductors, or the like) therein. In some embodiments, the interposer substrate 110 may be a device wafer including active and/or passive devices thereon. The interposer substrate 110 may be a semiconductor substrate or a dielectric substrate. While being a semiconductor substrate, the interposer substrate 110 may be a bulk semiconductor substrate, a silicon-on-insulator (SOI) substrate, a multi-layered semiconductor substrate, or the like. The semiconductor material of the interposer substrate 110 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The interposer substrate 110 may be doped or undoped. In some other embodiments, the interposer substrate 110 may be a package substrate, which may include a core or may be a core-less substrate, or a glass substrate.

In accordance with some embodiments, through-vias (TVs) 111 are formed to extend from a first surface 110A of the interposer substrate 110 to a second surface 110B opposite the first surface 110A of the interposer substrate 110, as shown in FIG. 1B. The through-vias 111 are also sometimes referred to as through-substrate vias or through-silicon vias when the interposer substrate 110 is a silicon substrate. The through-vias 111 may be formed by forming openings in the interposer substrate 110 by, for example, etching, milling, laser techniques, a combination thereof, and/or the like. A thin dielectric material may be formed in the openings, such as by using an oxidation process or a conformal deposition process. A thin barrier layer may be conformally deposited in the openings, such as by CVD, ALD, PVD, thermal oxidation, a combination thereof, and/or the like. A conductive material, such as copper, tungsten, aluminum, silver, gold, a combination thereof, and/or the like, may be deposited over the thin barrier layer and in the openings. The conductive material may be formed by an electro-chemical plating process, CVD, ALD, PVD, a combination thereof, and/or the like. Excess portions of conductive material and barrier layer are removed from the first and second surfaces 110A and 110B of the interposer substrate 110 by, for example, CMP. Thus, the through-vias 111 may include a conductive material and a thin barrier layer between the conductive material and the interposer substrate 110.

In accordance with some embodiments, an interconnect structure layer 112, sometimes referred to as redistribution layer (RDL), is formed on the second surface 110B as shown in FIG. 1B, and is used to electrically connect to the internal circuitry (such as through-vias 111) of the interposer substrate 110. Although not shown, the interconnect structure layer 112 may include a plurality of dielectric layers. Metal lines may be formed in the dielectric layers. Conductive vias may be formed between, and interconnecting, the overlying and underlying metal lines. In accordance with some embodiments, the dielectric layers is formed of silicon oxide, silicon nitride, silicon carbide, silicon oxynitride, combinations thereof, and/or multi-layers thereof. Alternatively, the dielectric layers may comprise one or more low-k dielectric layer having low k values. The materials of the metal lines and conductive vias (collectively called conductive features) of the interconnect structure layer 112 may be the same or similar to those of the conductive features 106 illustrated in FIG. 1A.

Additionally, conductive structures 113 (sometimes also called electrical connectors) may be formed at the top surface 112A of the interconnect structure layer 112, and used to electrically couple to the conductive features therein and to interconnect to the subsequently attached semiconductor devices (which will be described later), in accordance with some embodiments. Each of the conductive structures 113 may include a metal pillar 113A and a metal cap layer 113B (such as a solder cap) over the metal pillar 113A, as shown in FIG. 1B. The conductive structures 113 including the metal pillars 113A and the metal cap layers 113B are sometimes referred to as micro bumps. The metal pillars 113A may include a conductive material such as copper, aluminum, gold, nickel, palladium, the like, or a combination thereof, and may be formed by sputtering, printing, electroplating, electroless plating, CVD, or the like. The metal pillars 113A may be solder-free and have substantially vertical sidewalls. In accordance with some embodiments, a metal cap layer 113B is formed on the top of a metal pillar 113A. The metal cap layers 113B may include nickel, tin, tin-lead, gold, copper, silver, palladium, indium, nickel-palladium-gold, nickel-gold, the like, or a combination thereof, and may be formed by a plating process such as an electroplating process. One of ordinary skill in the art would appreciate that the above conductive structures 113 examples are provided for illustrative purposes, and other structures of the conductive structures 113 may also be used.

As shown in FIG. 1B, semiconductor devices 128 (for simplicity, only two semiconductor devices 128 are shown) are bonded to a first side of the interposer substrate 110 through flip-chip bonding by way of the conductive structures 113 and the conductive elements 130 on the semiconductor devices 128 to form conductive joints, in accordance with some embodiments. Conductive elements 130, such as conductive pillars, may be formed at an active surface of each semiconductor device 128 on the exposed contact pads (not shown) before the bonding process The conductive elements 130 may be similar to the conductive elements 108 illustrated in FIG. 1A, and thus the description is not repeated herein. The semiconductor devices 128 may be placed on the conductive structures 113 over the interposer substrate 110 using, for example, a pick-and-place tool.

In accordance with embodiments, each of the semiconductor devices 128 includes a semiconductor chip, an active device (such as a transistor, diode, photodiode, or the like), a passive device (such as a resistor, capacitor, inductor, or the like), or a combination thereof. The semiconductor chip may include any type of functional integrated circuit, such as a processor, logic circuitry, memory, analog circuit, digital circuit, mixed signal circuit, or the like. In some alternative embodiments, each semiconductor device 128 may include a package module including a package substrate and one or more semiconductor chips or dies mounted thereon. In some embodiments, the semiconductor devices 128 include different types of electronic devices. For example, some semiconductor devices 128 are memory devices, while other semiconductor devices 128 are processor devices, but other combinations can also be used. In some other embodiments, the semiconductor devices 128 include the same type of electronic devices.

The bonding between the semiconductor devices 128 and the interposer substrate 110 may be solder bonding or direct metal-to-metal (such as a copper-to-copper) bonding. In some embodiments, the semiconductor devices 128 are bonded to the interposer substrate 110 through a reflow process. During the reflow process, the conductive joints (the conductive structures 113 and conductive elements 130) are in contact with the exposed contact pads of the semiconductor devices 128 and the exposed contact pads (constructed by some conductive features in the interconnect structure layer 112) of the interconnect structure layer 112, respectively, to physically and electrically couple the semiconductor devices 128 to the interposer substrate 110.

In some embodiments, an underfill element 132 is formed to surround and protect the conductive joints (the conductive structures 113 and conductive elements 130), and enhances the connection between the semiconductor devices 128 and the interposer substrate 110, as shown in FIG. 1B. The underfill element 132 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into a gap between each semiconductor device 128 and the interposer substrate 110 to reinforce the strength of the conductive joints and therefore the overall package structure. After the dispensing, the underfill material is cured to form the underfill element 132. The underfill element 132 may also provide a thermal conduction path for the package structure. In this embodiments, the underfill element 132 fills the whole gap between the semiconductor device 128 and the interposer substrate 110, and covers all the lower surface of the semiconductor device 128. In some other embodiments, the underfill element 132 is not formed, or merely covers portions of the lower surface of the semiconductor device 128.

Figure 1C:
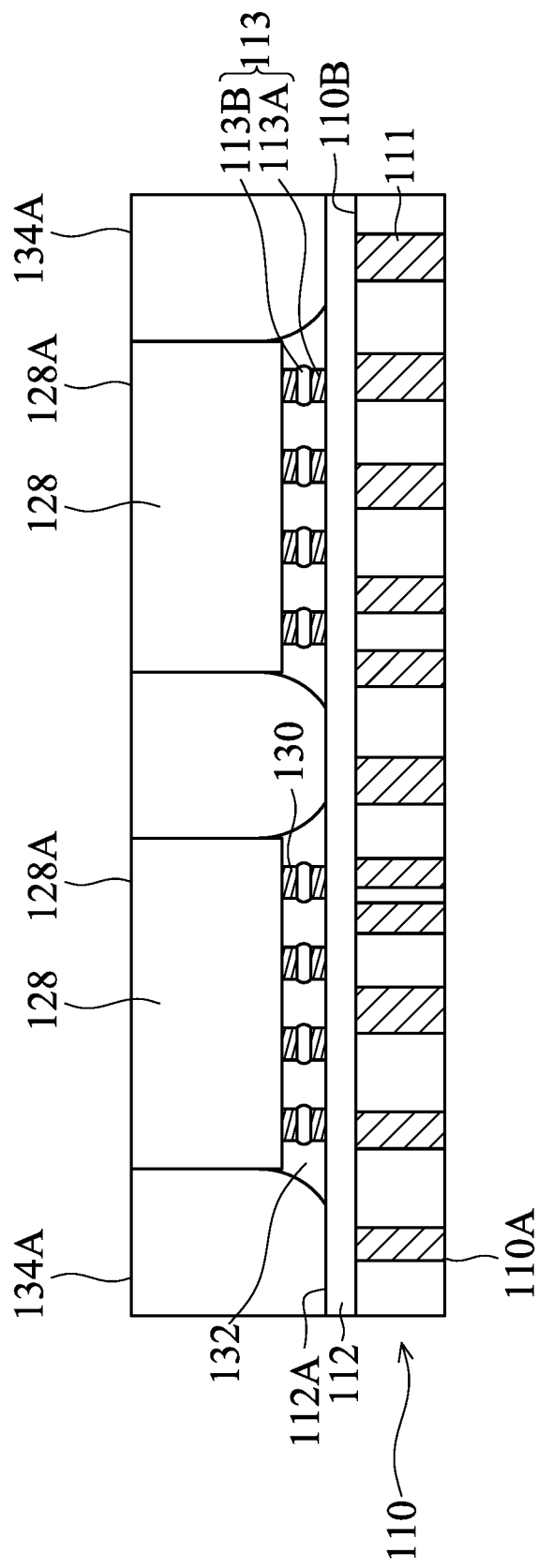

As shown in FIG. 1C, a protective layer 134 is formed to surround and protect the semiconductor devices 128 over the interposer substrate 110, in accordance with some embodiments. In some embodiments, the protective layer 134 is separated from the conductive joints below the semiconductor devices 128 by the underfill element 132. However, embodiments of the disclosure are not limited thereto. In some other embodiments, the underfill element 132 is not formed. In these cases, the protective layer 134 may be in direct contact with the conductive joints below the respective semiconductor device 128.

In some embodiments, the protective layer 134 is made of or includes an insulating material such as a molding material. The molding material may include a polymer material, such as an epoxy-based resin with fillers dispersed therein. In some embodiments, a molding material (such as a liquid molding material) is dispensed over the interposer substrate 110 and/or over the semiconductor devices 128. In some embodiments, a thermal process is then used to cure the liquid molding material and to transform it into the protective layer 134.

In some embodiments, a planarization process is applied on the protective layer 134 to partially remove the protective layer 134. As a result, the top surface 128A of each semiconductor device 128 is exposed (i.e., the top surface 128A of each semiconductor device 128 is substantially flush with the top surface 134A of the protective layer 134) for heat dissipation, as shown in FIG. 1C. The planarization process may include a grinding process, a chemical mechanical polishing (CMP) process, an etching process, a dry polishing process, one or more other applicable processes, or a combination thereof. In some other embodiments where the semiconductor devices 128 have different heights, after the planarization process, one of the semiconductor devices 128 may be buried in the protective layer 134 while other semiconductor devices 128 may be exposed from the protective layer 134.

Figure 1D:
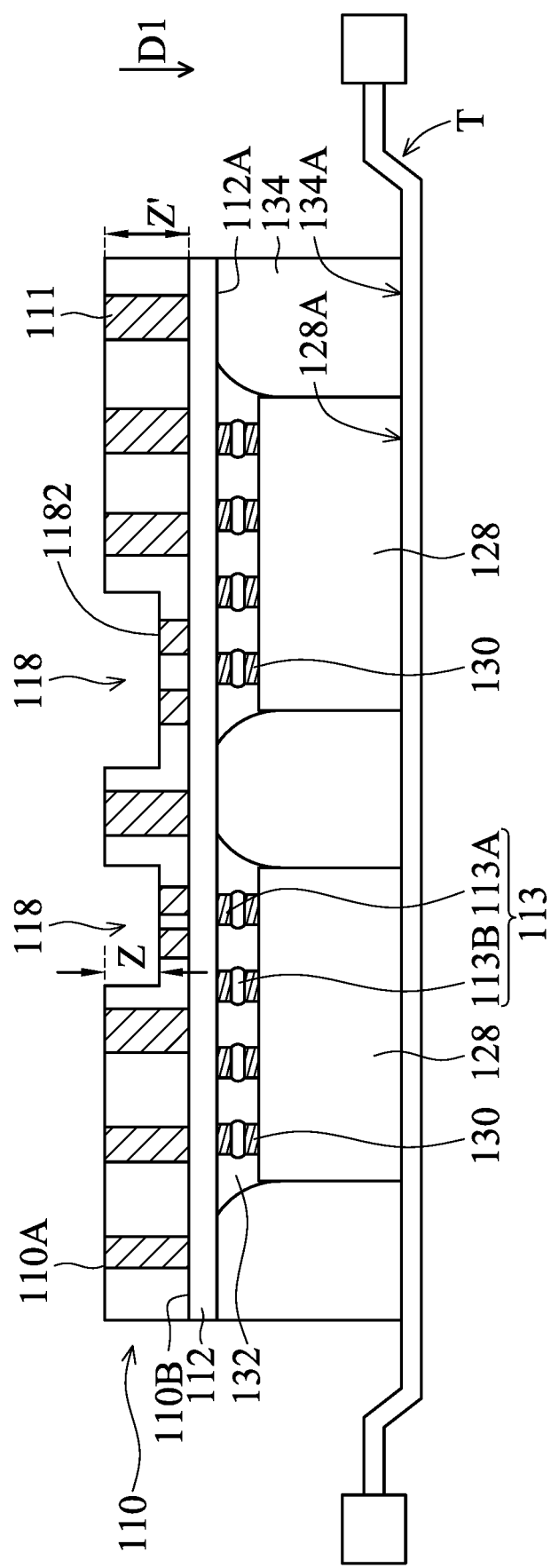

As shown in FIG. 1D, the resulting structure of FIG. 1C is turned upside down and is placed so that the semiconductor device 128 side is affixed to a dicing tape T, in accordance with some embodiments. Afterwards, several cavities 118 (for simplicity, only two cavities 118 are shown) are formed on the first surface 110A of the interposer substrate 110. In some embodiments, each cavity 118 extends from the first surface 110A to the inside of the interposer substrate 110 but does not penetrate through the interposer substrate 110 (for example, the bottom surface 1182 of each cavity 118 is spaced apart from the second surface 110B of the interposer substrate 110 near the semiconductor devices 128). Each cavity 118 may have an appropriate depth Z in a direction D1 substantially perpendicular to the first surface 110A of the interposer substrate 110 to receive or accommodate one or more other semiconductor devices described below. In some embodiments, the (maximum) depth Z of the cavity 118 does not exceed 90% of the thickness Z' of the interposer substrate 110 in the direction D1 to allow at least one conductive layer in the interposer substrate 110 to be reserved for routing.

The cavities 118 may be formed using a wet or dry etching process, an energy beam drilling process (such as a laser beam drilling process, an ion beam drilling process, or an electron beam drilling process), a mechanical drilling process, one or more other applicable processes, or a combination thereof. The sidewalls of each cavity 118 may be vertical to or inclined relative to the bottom surface 1182.

Figure 1E:
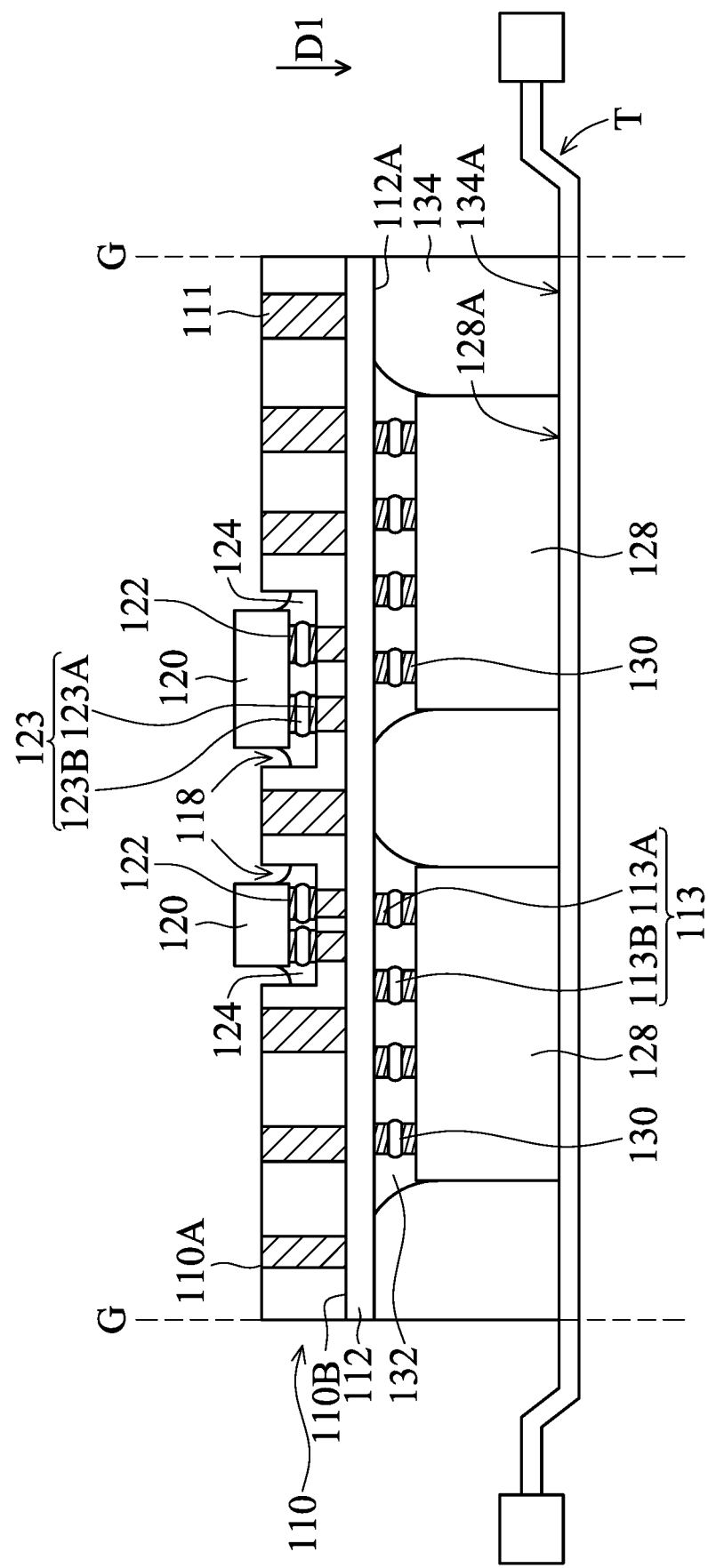

As shown in FIG. 1E, semiconductor devices 120 are placed or received in the cavities 118 of the interposer substrate 100, in accordance with some embodiments. There may be one semiconductor device 120 in each cavity 118. In some other embodiments, there is more than one semiconductor device 120 in at least one of the cavities 118. Each cavity 118 may be shaped and sized to correspond to the shape and size (in the section perpendicular to the direction D1) of the received semiconductor device(s) 120.

In some embodiments, the semiconductor devices 120 each includes a semiconductor chip, an active device (such as a transistor, diode, photodiode, or the like), a passive device (such as a resistor, capacitor, inductor, or the like), a semiconductor die with metallic routing only (i.e., without a functional chip), a package module including a package substrate and one or more semiconductor chips or dies mounted thereon, or a combination thereof. The semiconductor chip may include any type of functional integrated circuit, such as a processor, logic circuitry, memory, analog circuit, digital circuit, mixed signal circuit, or the like. In some embodiments, the semiconductor devices 120 include different types of electronic devices. For example, some semiconductor devices 120 are memory devices, while other semiconductor devices 120 are semiconductor dies with metallic routing only, but other combinations can also be used. In some other embodiments, the semiconductor devices 120 include the same type of electronic devices. In various embodiments, the semiconductor devices 120 and 128 on opposite sides of the interposer substrate 110 may be or include the same or different types of electronic devices.

As shown in FIG. 1E, the semiconductor devices 120 are placed (by a pick-and-place tool, for example) on the bottom surfaces 1182 (see FIG. 1D) of the cavities 118, and are bonded to the interposer substrate 110 (for example, electrically connected to some internal through-vias 111) through flip-chip bonding by way of the conductive structures 123 (each including a metal pillar 123A and a metal cap layer 123B over the metal pillar 123A) formed on the bottom surfaces 1182 and the conductive elements 122 (such as conductive pillars) on the semiconductor devices 120 to form conductive joints, in accordance with some embodiments. The materials and formation methods of the conductive structures 123 and the conductive elements 122 may be the same or similar to those of the conductive structures 113 and the conductive elements 130, respectively, illustrated in FIG. 1B. The bonding between the semiconductor devices 120 and the interposer substrate 110 may be solder bonding or direct metal-to-metal (such as a copper-to-copper) bonding in some embodiments, similar to the bonding between the semiconductor devices 128 and the interposer substrate 110 as described above.

In some embodiments, an underfill element 124 (similar to the underfill element 132 illustrated in FIG. 1B) is also formed to surround and protect the conductive joints (the conductive structures 123 and conductive elements 122), and enhances the connection between the semiconductor devices 120 and the interposer substrate 110, as shown in FIG. 1E. In these embodiments, the underfill element 124 fills the whole gap between each semiconductor device 120 and the bottom surface 1182 of the respective cavity 118, and covers all the lower surface of the semiconductor device 120. The underfill element 124 may also provide a thermal conduction path for the package structure. In some other embodiments, the underfill element 124 is not formed, or merely covers portions of the lower surface of the semiconductor device 120.

Afterward, a singulation process (also referred to as a saw process) is carried along cutting grooves G shown in FIG. 1E, to form multiple separate package structures, in accordance with some embodiments. In FIG. 1E, one of the package structures is shown. Afterward, each package structure is removed from the dicing tape T by using a pick-and-place tool (not shown).

Figure 1F:
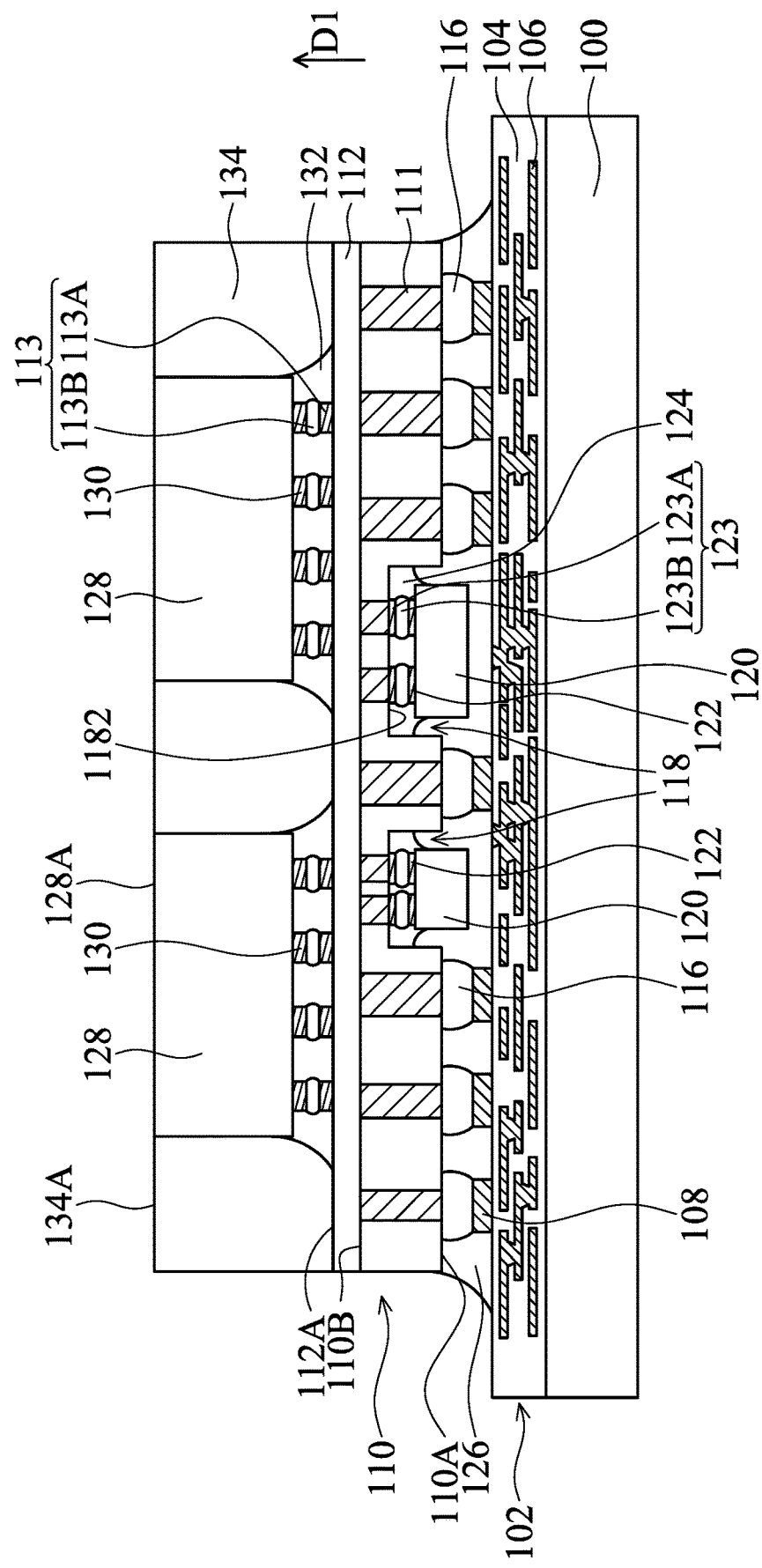

As shown in FIG. 1F, the resulting package structure in FIG. 1E is placed (by a pick-and-place tool, for example) over the package substrate 102 so that the first surface 110A of the interposer substrate 110 faces the package substrate 102, in accordance with some embodiments. Afterwards, the interposer substrate 110 (integrated with the semiconductor devices 120 and 128) is bonded onto the conductive elements 108 through conductive structures 116. The conductive structures 116 may include solder bumps, solder balls, conductive pillars, other suitable conductive elements, or a combination thereof. In accordance with some embodiments, the materials and formation method of the conductive structures 116 may be the same or similar to those of the conductive structures 113 illustrated in FIG. 1B. Although not shown, the conductive structures 116 may be formed onto the first surface 110A of the interposer substrate 110 and electrically connected to the internal circuitry in the processing step illustrated in FIG. 1E (before removing the dicing tape T).

In some embodiments, the interposer substrate 110 and the package substrate 102 are pressed against each other at an elevated temperature. As a result, the interposer substrate 110 is bonded to the package substrate 102 through the conductive structures 116. In some embodiments, a thermal compression process is used to achieve the bonding process mentioned above.

As shown in FIG. 1F, while the interposer substrate 110 is stacked over the package substrate 102, each semiconductor device 120 below the interposer substrate 110 is separated from the package substrate 102 by a gap, in accordance with some embodiments. Since cavities 118 are formed on the first surface 110A of the interposer substrate 110 to accommodate the semiconductor devices 120, the size (e.g., the height in the direction D1) of the conductive structures 116 may be smaller than what would be possible using an interposer substrate without a cavity. This is because the size of the conductive structures 116 no longer needs to be greater than the thickness of the semiconductor devices 120. As a result, a thinner overall package structure can be obtained.

As shown in FIG. 1F, an underfill element 126 is also formed to surround and protect the conductive structures 116 and the conductive elements 108 between the interposer substrate 110 and the package substrate 102, and enhances the connection between the interposer substrate 110 and the package substrate 102, in accordance with some embodiments. In some embodiments, the underfill element 126 also surrounds and protects the semiconductor devices 120 below the interposer substrate 110. In some embodiments, a portion of the underfill element 126 is in a gap between each semiconductor device 120 and the package substrate 102, as shown in FIG. 1F. In cases where the underfill element 124 is omitted, the underfill element 126 may be formed in the cavities 118 and in direct contact with the conductive joints (the conductive structures 123 and the conductive elements 122) below the respective semiconductor device 120. The materials and formation method of the underfill element 126 may be the same or similar to those of the underfill element 124 illustrated in FIG. 1E.

Figure 1G:
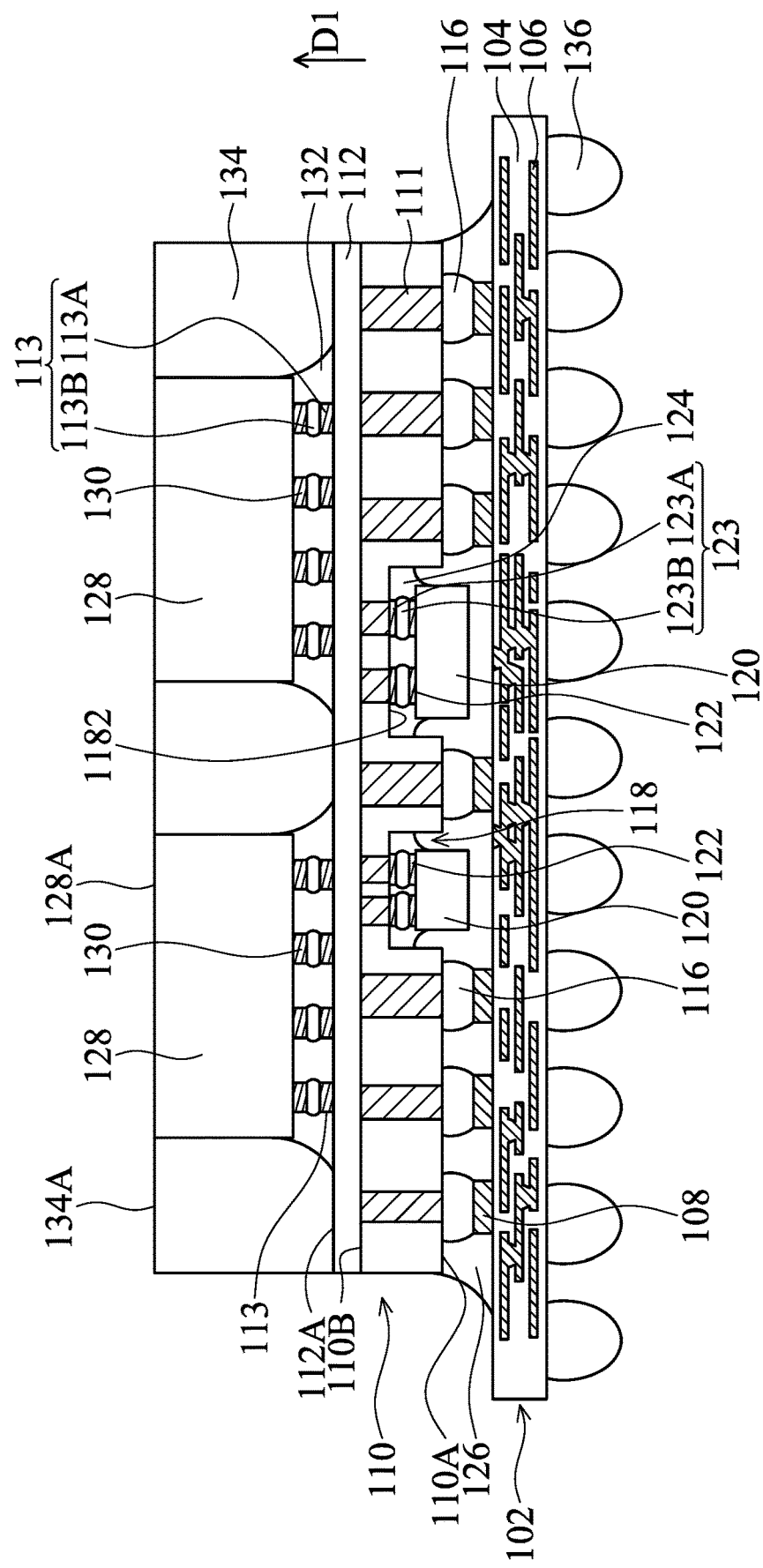

Afterwards, the carrier substrate 100 is removed to expose a surface of the package substrate 102, as shown in FIG. 1G, in accordance with some embodiments. In some embodiments, a release film (not shown) is previously formed over the carrier substrate 100 before the formation of the package substrate 102. The release film is a temporary bonding material, which facilitates the separation operation between the carrier substrate 100 and the package substrate 102.

In some embodiments, conductive bumps 136 are then formed over the surface of the package substrate 102 that is originally covered by the carrier substrate 100, as shown in FIG. 1G. Each conductive bump 136 may be electrically connected to one of the conductive features 106 of the package substrate 102. The conductive bumps 136 enable electrical connection between the package structure and an external device (not shown). The conductive bumps 136 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed conductive features 106 after the removal of the carrier substrate 100. A reflow process is then carried out to melt the solder balls into the conductive bumps 136. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 136.

As a result, the process for forming the resulting package structure illustrated in FIG. 1G, which includes a chip-on-wafer-on-substrate (CoWoS) package structure, is completed. In the package structure in FIG. 1G, the semiconductor devices 128 and 120 may communicate with each other through the internal circuitry of the interposer substrate 110. Accordingly, the RC delay and/or signal noise are significantly reduced, and the signal transmission speed is improved. Consequently, the electrical performance of the overall package structure is improved. Furthermore, as discussed above, a smaller overall package size can also be achieved due to the cavities 118 of the interposer substrate 110.

Many variations and/or modifications can be made to embodiments of the disclosure. For example, the number of the cavities 118, semiconductor devices 128 and/or 120 in one package structure are not limited to the embodiments described above and may vary in different embodiments.

Figure 2:
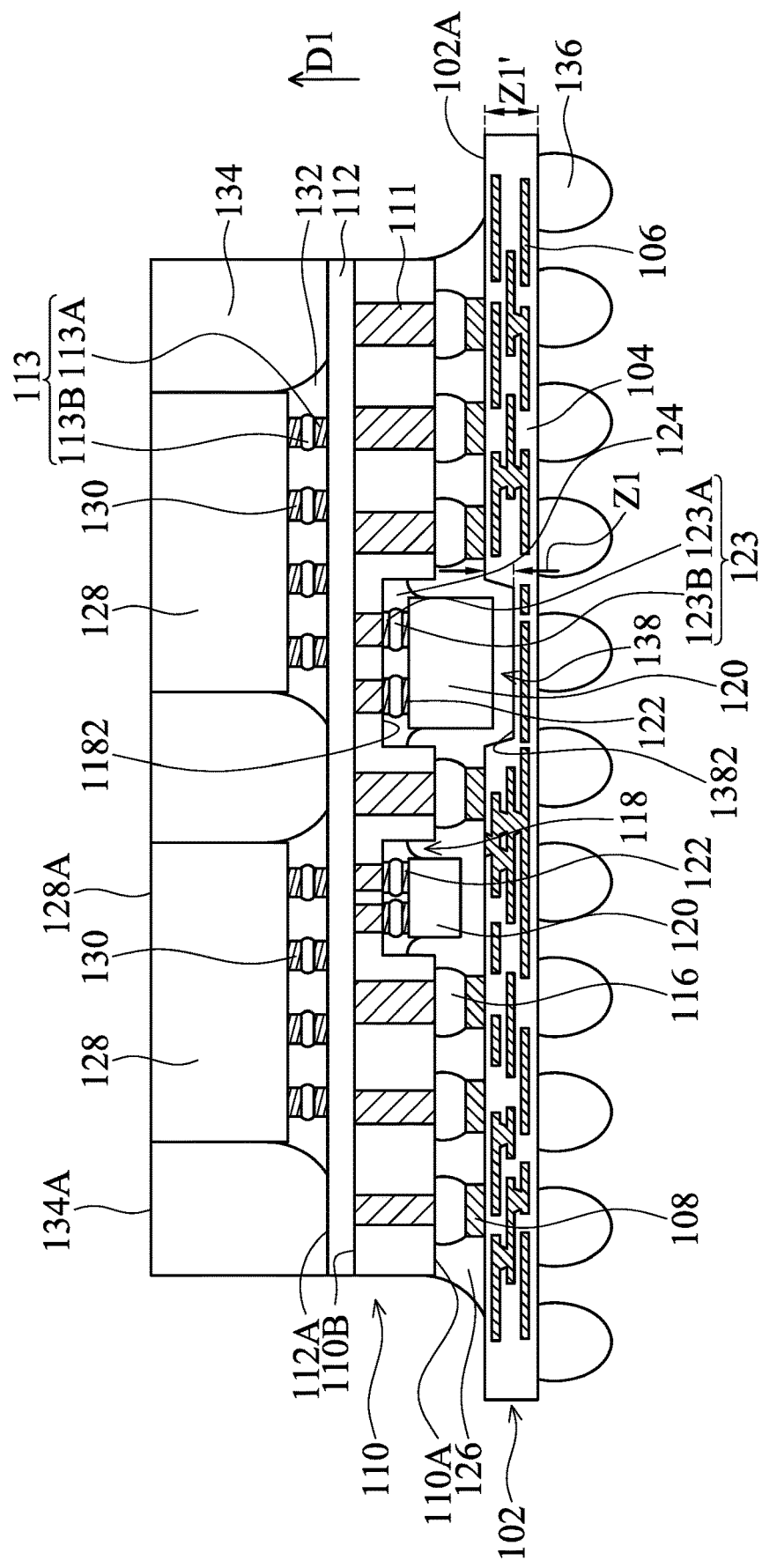
FIG. 2 is a cross-sectional view of a package structure, in accordance with some embodiments.

Many variations and/or modifications can be made to embodiments of the disclosure. FIG. 2 is a cross-sectional view of a package structure, in accordance with some embodiments. In some embodiments, a cavity 138 is further formed on the top surface 102A of the package substrate 102 facing and adjacent to the interposer substrate 110, and is aligned with one cavity 118 (e.g., the right cavity 118 shown in the figure) of the interposer substrate 110 to allow the semiconductor device 120 received in that cavity 118 to extend into the cavity 138. In some embodiments, the semiconductor device 120 is separated from the bottom surface 1382 of the cavity 138 by a gap, as shown in FIG. 2. As such, a portion of the underfill element 126 is in a gap between the semiconductor device 120 and the bottom surface 1382 of the cavity 138. As a result of the cavity 138, a thinner overall package structure can also be obtained for reasons similar to the cavities 118 described above.

In some embodiments, the cavity 138 of the package substrate 102 is formed before the interposer substrate 110 is stacked over the package substrate 102. The formation method of the cavity 138 may be similar to that of the cavities 118 illustrated in FIG. 1D. In some embodiments, the (maximum) depth Z1 of the cavity 138 in the direction D1 does not exceed 50% of the thickness Z1' of the package substrate 102 in the direction D1 to maintain sufficient structural strength of the package substrate 102. The sidewalls of the cavity 138 may be vertical to or inclined relative to the bottom surface 1382.

In some other embodiments, there are more than one cavity 138 formed on the top surface 102A of the package substrate 102 and aligned with the respective cavities 118 of the interposer substrate 110 to accommodate the semiconductor devices 120 mounted on the lower side of the interposer substrate 110.

Figure 3:
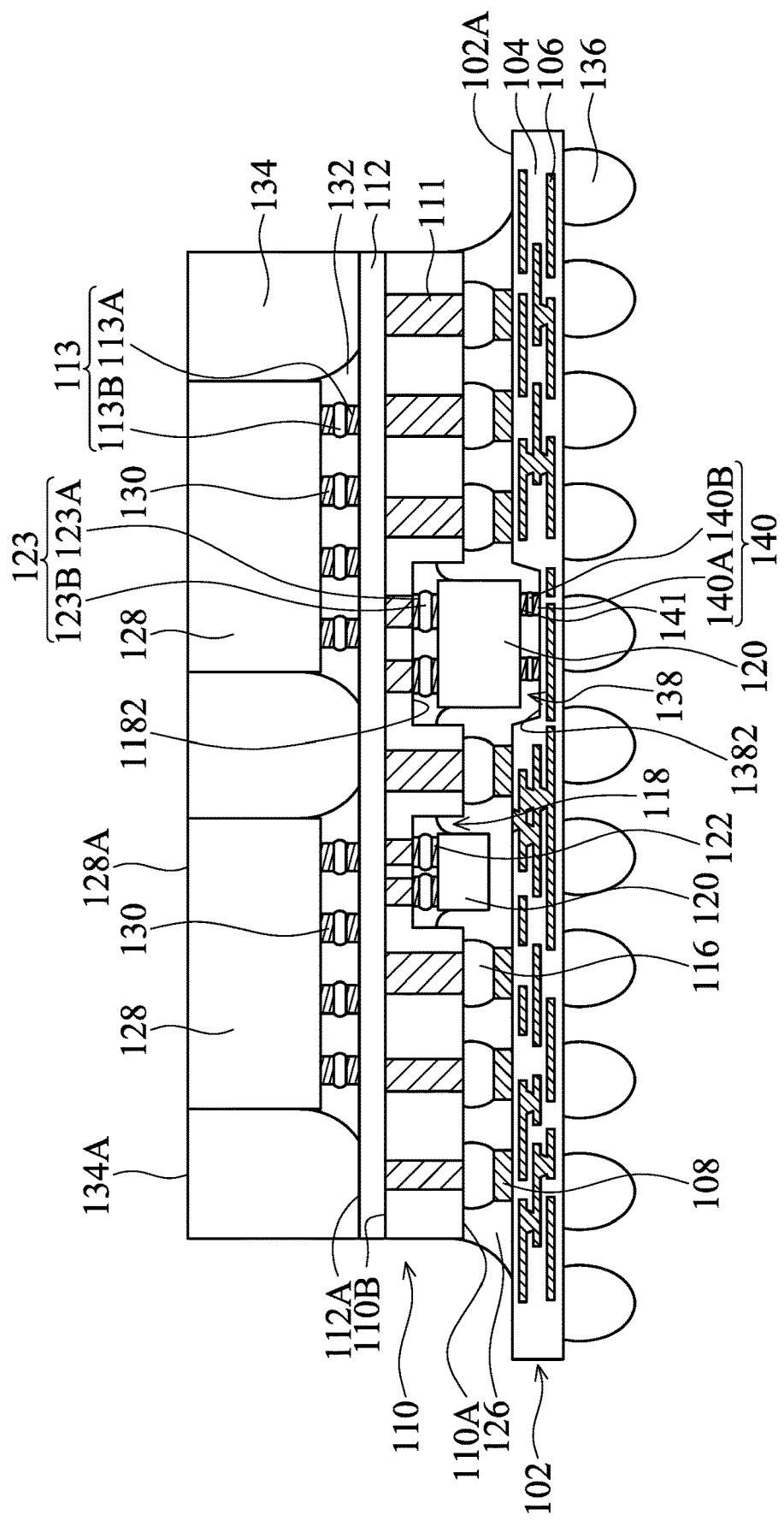
FIG. 3 is a cross-sectional view of a package structure, in accordance with some embodiments.

Many variations and/or modifications can be made to embodiments of the disclosure. FIG. 3 is a cross-sectional view of a package structure, in accordance with some embodiments. As shown in FIG. 3, at least one semiconductor device 120 (e.g., the right one shown in the figure) received in one cavity 118 of the interposer substrate 110 extends into the corresponding cavity 138 of the package substrate 102 (similar to the embodiments of FIG. 2). Also, the semiconductor device 120 is further bonded onto the exposed contact pads (constructed by some of the conductive features 106) at the bottom surface 1382 of the cavity 138 through flip-chip bonding by way of the conductive structures 140 (each including a metal pillar 140A and a metal cap layer 140B over the metal pillar 140A) formed on the bottom surfaces 1382 and the conductive elements 141 (such as conductive pillars) on the semiconductor device 120 to form conductive joints, in accordance with some embodiments. The conductive joints enable electrical connection between the semiconductor device 120 (as well as the connected interposer substrate 110 and the semiconductor device 128 thereon) and the package substrate 102 after the interposer substrate 110 is stacked over the package substrate 102. The bonding between the semiconductor device 120 and the package substrate 102 may be solder bonding or direct metal-to-metal (such as a copper-to-copper) bonding. The materials and formation methods of the conductive structures 140 and the conductive elements 141 may be the same or similar to those of the conductive structures 123 and the conductive elements 122, respectively, illustrated in FIG. 1E.

In some embodiments, before stacking the interposer substrate 110 over the package substrate 102, the conductive elements 141 are formed on the surface of the semiconductor device 120 opposite the conductive elements 122, and are electrically connected to the exposed contact pads of the semiconductor device 120. The conductive elements 141 also electrically connect to the internal circuitry of the semiconductor device 120. For example, several conductive through-vias may be formed in and penetrating the semiconductor device 120 to interconnect the conductive elements 122 and the conductive elements 141 on opposite surfaces of the semiconductor device 120.

As shown in FIG. 3, the underfill element 126 formed also surrounds and protects the conductive joints (the conductive structures 140 and the conductive elements 141) below the semiconductor device 120, and enhances the connection between the semiconductor device 120 and the package substrate 102, in accordance with some embodiments. For example, a portion of underfill element 126 is in a gap between the semiconductor device 120 and the bottom surface 1382 of the cavity 138, as shown in FIG. 3. The portion of underfill element 126 may also help providing a thermal path for the semiconductor device 120.

As shown in FIG. 3, at least one semiconductor device 120 is electrically connected not only to the interposer substrate 110 but also to the package substrate 102, and hence the electrical performance of the overall package structure is improved.

Figure 4A:
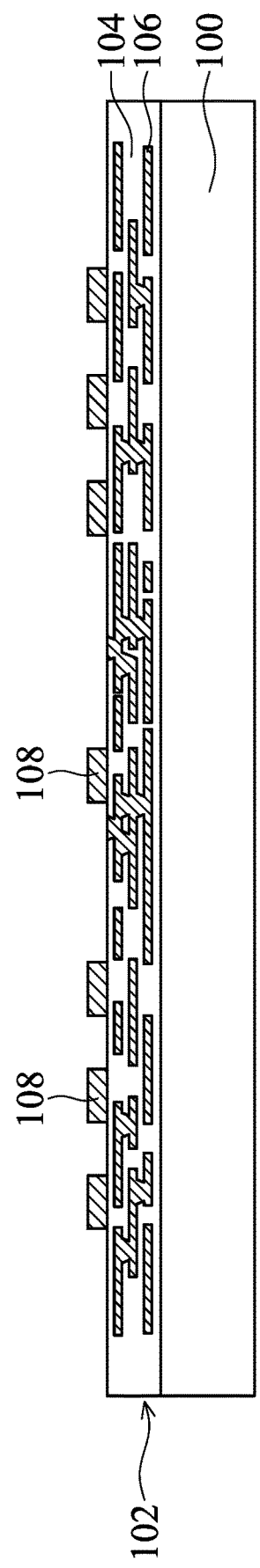
FIGS. 4A-4F are cross-sectional views of various stages of a process for forming a package structure, in accordance with some embodiments.

Many variations and/or modifications can be made to embodiments of the disclosure. FIGS. 4A-4F are cross-sectional views of various stages of a process for forming a package structure, in accordance with some embodiments. As shown in FIG. 4A, a structure including a package substrate 102 over a carrier substrate 100 that is similar to the structure shown in FIG. 1A is provided or received, in accordance with some embodiments.

Figure 4B:
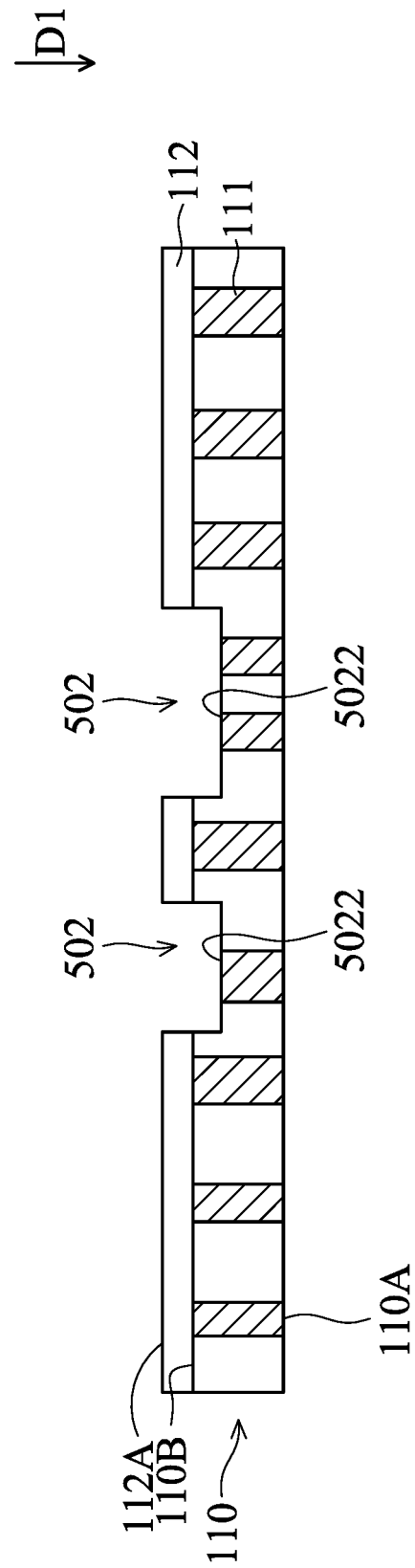

As shown in FIG. 4B, an interposer substrate 110 (similar to the interposer substrate 110 shown in FIG. 1A) to be stacked over the package substrate 102 (see FIG. 4A) is provided, in accordance with some embodiments. In some embodiments, the interposer substrate 110 may include an interconnect structure layer 112 (also referred to as redistribution layer (RDL) formed on the second surface 110B thereof, as previously discussed. In some embodiments, cavities 502 are formed in the interposer substrate 110 (it should be understood that only two cavities 502 are shown in the figure for simplicity). In some embodiments, each cavity 502 is formed to extend from the top surface 112A of the interconnect structure layer 112 to the inside of the interposer substrate 110, but does not penetrate through the interposer substrate 110. For example, the bottom surface 5022 of each cavity 502 is spaced apart from the first surface 110A opposite the second surface 110B of the interposer substrate 110, as shown in FIG. 4B. Each cavity 502 may have an appropriate depth in a direction D1 substantially perpendicular to the second surface 110B to receive or accommodate one or more semiconductor devices described below, as previously discussed with reference to the cavity 118 illustrated in FIG. 1D.

The cavities 502 may be formed using a wet or dry etching process, an energy beam drilling process (such as a laser beam drilling process, an ion beam drilling process, or an electron beam drilling process), a mechanical drilling process, one or more other applicable processes, or a combination thereof. The sidewalls of each cavity 502 may be vertical to or inclined relative to the bottom surface 5022.

Figure 4C:
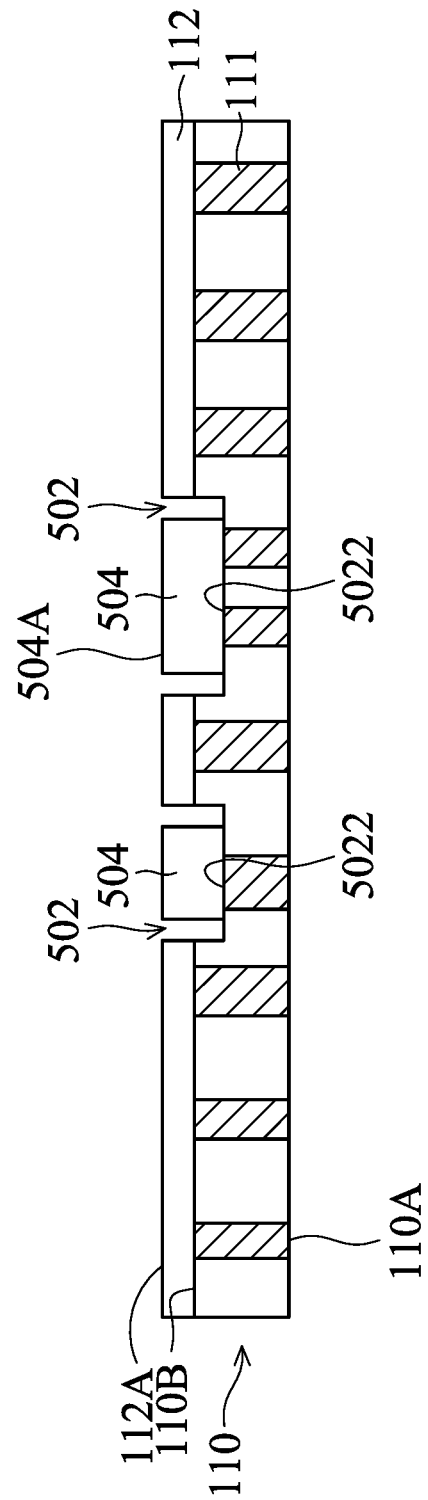

As shown in FIG. 4C, semiconductor devices 504 (for simplicity, only two semiconductor device 504 are shown) are placed (by a pick-and-place tool, for example) in the cavities 502 of the interposer substrate 100, in accordance with some embodiments. There may be one semiconductor device 504 in each cavity 502. In some other embodiments, there is more than one semiconductor device 504 in one of the cavities 502. Each cavity 502 may be shaped to correspond to the shape and size of the received semiconductor device(s) 504. In some embodiments, each cavity 502 is designed to have an appropriate depth so that the top surface 504A of the respective semiconductor device 504 is substantially flush with the top surface 110B of the interposer substrate 110 after the semiconductor devices 504 are placed in the cavities 502 (e.g., disposed on the bottom surface 5022 of the respective cavity 502). In some embodiments, each semiconductor devices 504 may be fixed to the bottom surface 5022 of the respective cavity 502 through an adhesive (not shown). In these embodiments, the semiconductor devices 504 are electrically isolated from the interposer substrate 110. Examples of the material for the adhesive may include organic adhesive material such as epoxy, polyimide (PI), polybenzoxazole (PBO), benzo-cyclo-butene (BCB), but are not limited thereto.

In some embodiments, the semiconductor devices 504 each includes a semiconductor chip, an active device (such as a transistor, diode, photodiode, or the like), a passive device (such as a resistor, capacitor, inductor, or the like), a semiconductor die with metallic routing only (i.e., without a functional chip), a package module including a package substrate and one or more semiconductor chips or dies mounted thereon, or a combination thereof. The semiconductor chip may include any type of functional integrated circuit, such as a processor, logic circuitry, memory, analog circuit, digital circuit, mixed signal circuit, or the like. In some embodiments, the semiconductor devices 504 include different types of electronic devices. For example, some semiconductor devices 504 are memory devices, while other semiconductor devices 504 are semiconductor dies with metallic routing only. In some other embodiments, the semiconductor devices 504 include the same type of electronic devices.

Figure 4D:
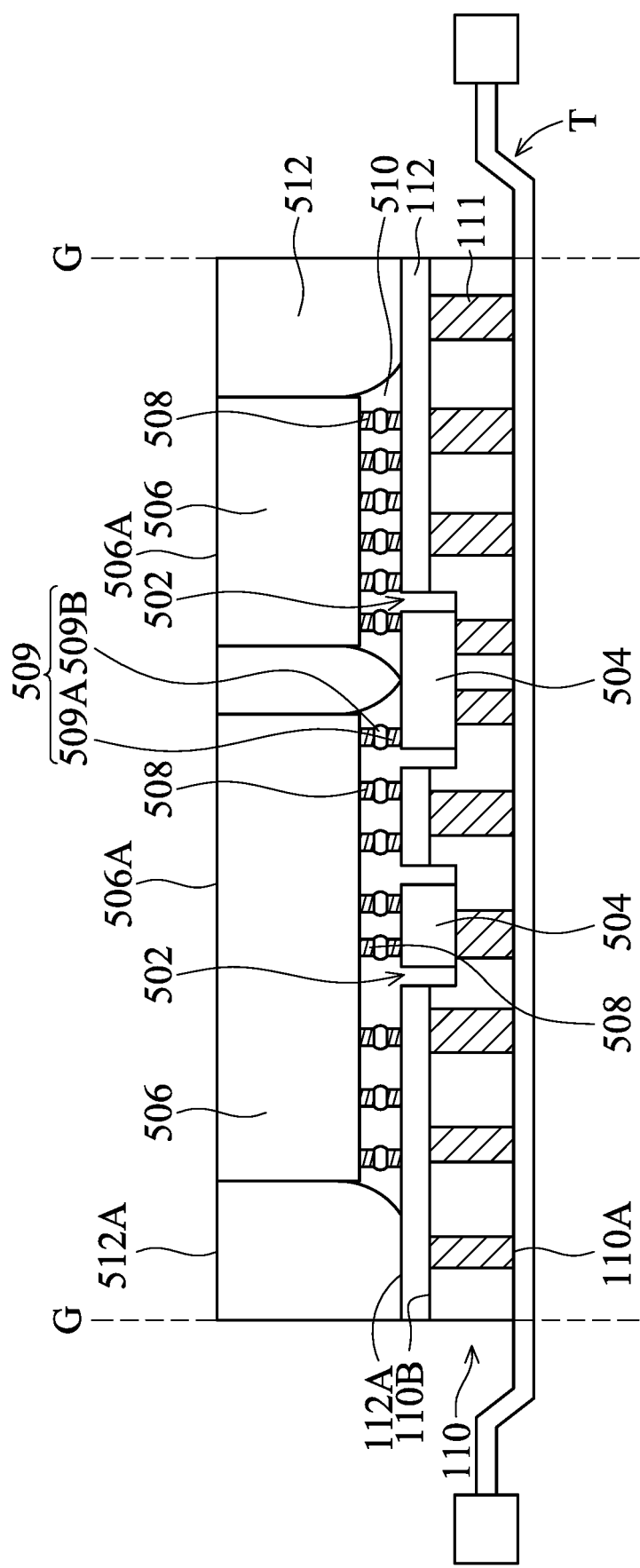

As shown in FIG. 4D, semiconductor devices 506 (for simplicity, only two semiconductor devices 506 are shown) are then stacked over the interposer substrate 110 (by a pick-and-place tool, for example), in accordance with some embodiments. In some embodiments, the semiconductor devices 506 each includes a semiconductor chip, an active device (such as a transistor, diode, photodiode, or the like), a passive device (such as a resistor, capacitor, inductor, or the like), or a combination thereof. The semiconductor chip may include any type of functional integrated circuit, such as a processor, logic circuitry, memory, analog circuit, digital circuit, mixed signal circuit, or the like. In some alternative embodiments, each of the semiconductor devices 506 includes a package module including a package substrate and one or more semiconductor chips or dies mounted thereon, In some embodiments, the semiconductor devices 506 include different types of electronic devices. For example, some semiconductor devices 506 are memory devices, while other semiconductor devices 506 are processor devices. In some other embodiments, the semiconductor devices 506 include the same type of electronic devices. In various cases, the semiconductor devices 506 over the interposer substrate 110 and the semiconductor devices 504 received in the cavities 502 may be or include the same or different types of electronic devices.

As shown in FIG. 4D, each semiconductor device 506 is disposed on the top surface 112A of the interconnect structure layer 112, and is boned onto some exposed contact pads (constructed by some of the conductive features of the interconnect structure layer 112) of the interconnect structure layer 112 and some exposed contact pads of one or more semiconductor devices 504 received in the cavities 502 through flip-chip bonding by way of the conductive structures 509 (each including a metal pillar 509A and a metal cap layer 509B over the metal pillar 509A) on the top surface 112A of the interconnect structure layer 112 or on the semiconductor devices 504 and the conductive elements 508 (such as conductive pillars) on the semiconductor device 506 to form conductive joints, in accordance with some embodiments. The materials and formation methods of the conductive structures 509 and the conductive elements 508 may be the same or similar to those of the conductive structures 113 and the conductive elements 130, respectively, illustrated in FIG. 1B. The bonding between the semiconductor devices 506 and the interposer substrate 110 as well as the semiconductor devices 504 may be solder bonding or direct metal-to-metal (such as a copper-to-copper) bonding in some embodiments In accordance with some embodiments as shown in FIG. 4D, after the semiconductor devices 506 are disposed over the interposer substrate 110, one semiconductor device 504 received in one cavity 502 (e.g., the left cavity 502 shown in the figure) is located directly below one of the semiconductor devices 506 (e.g., the left semiconductor device 506 shown in the figure), and the semiconductor device 506 is bonded onto the exposed contact pads of that semiconductor device 504 through some conductive joints between the semiconductor devices 506 and 504. Moreover, another semiconductor device 504 received in another cavity 502 (e.g., the right cavity 502 shown in the figure) is located between and below two adjacent semiconductor devices 506, and the two adjacent semiconductor devices 506 are respectively bonded onto some exposed contact pads of that semiconductor device 504 through some conductive joints between the semiconductor device 504 and one of the semiconductor devices 506 and through other some conductive joints between the semiconductor device 504 and the other semiconductor devices 506.

Afterwards, an underfill element 510 is formed to surround and protect the conductive joints (the conductive structures 509 and the conductive elements 508), and enhances the connection between the semiconductor devices 506 and the interposer substrate 110 and/or the semiconductor devices 504, in accordance with some embodiments. In some embodiments, the underfill element 510 also surrounds and protects the semiconductor devices 504 received in the interposer substrate cavities 502, as shown in FIG. 4D. In this embodiments, the underfill element 510 fills the whole gap between each semiconductor device 506 and the interposer substrate 110, and covers all the lower surface of the semiconductor device 506. In some other embodiments, the underfill element 510 is not formed, or merely covers portions of the lower surface of the semiconductor device 506. The materials and formation method of the underfill element 510 may be the same or similar to those of the underfill element 132 illustrated in FIG. 1B.

Afterwards, a protective layer 512 is formed to surround and protect the semiconductor devices 506, in accordance with some embodiments, as shown in FIG. 4D. In some embodiments, the protective layer 512 is separated from the conductive joints between the semiconductor devices 506 and the interposer substrate 110 and/or the semiconductor devices 504 received in the interposer substrate cavities 502 by the underfill element 510. However, embodiments of the disclosure are not limited thereto. In some other embodiments, the underfill element 510 is not formed. In these cases, the protective layer 512 may be in direct contact with the conductive joints. The materials and formation method of the protective layer 512 may be the same or similar to those of the protective layer 134 illustrated in FIG. 1C.

In some embodiments, a planarization process is applied on the protective layer 512 to partially remove the protective layer 512. As a result, the top surface 506A of each semiconductor device 506 is exposed (i.e., the top surface 506A of each semiconductor device 506 is substantially flush with the top surface 512A of the protective layer 512), as shown in FIG. 4D. The planarization process may include a grinding process, a chemical mechanical polishing (CMP) process, an etching process, a dry polishing process, one or more other applicable processes, or a combination thereof.

In some other embodiments where the semiconductor devices 506 have different heights, after the planarization process, one of the semiconductor devices 506 may be buried in the protective layer 512 while other semiconductor devices 506 may be exposed from the protective layer 512.

Afterward, a singulation process (also referred to as a saw process) is carried while the above structure is affixed to a dicing tape T along cutting grooves G shown in FIG. 4D, to form multiple separate package structures, in accordance with some embodiments. In FIG. 4D, one of the package structures is shown. Afterward, each package structure is removed from the dicing tape T by using a pick-and-place tool (not shown).

Figure 4E:
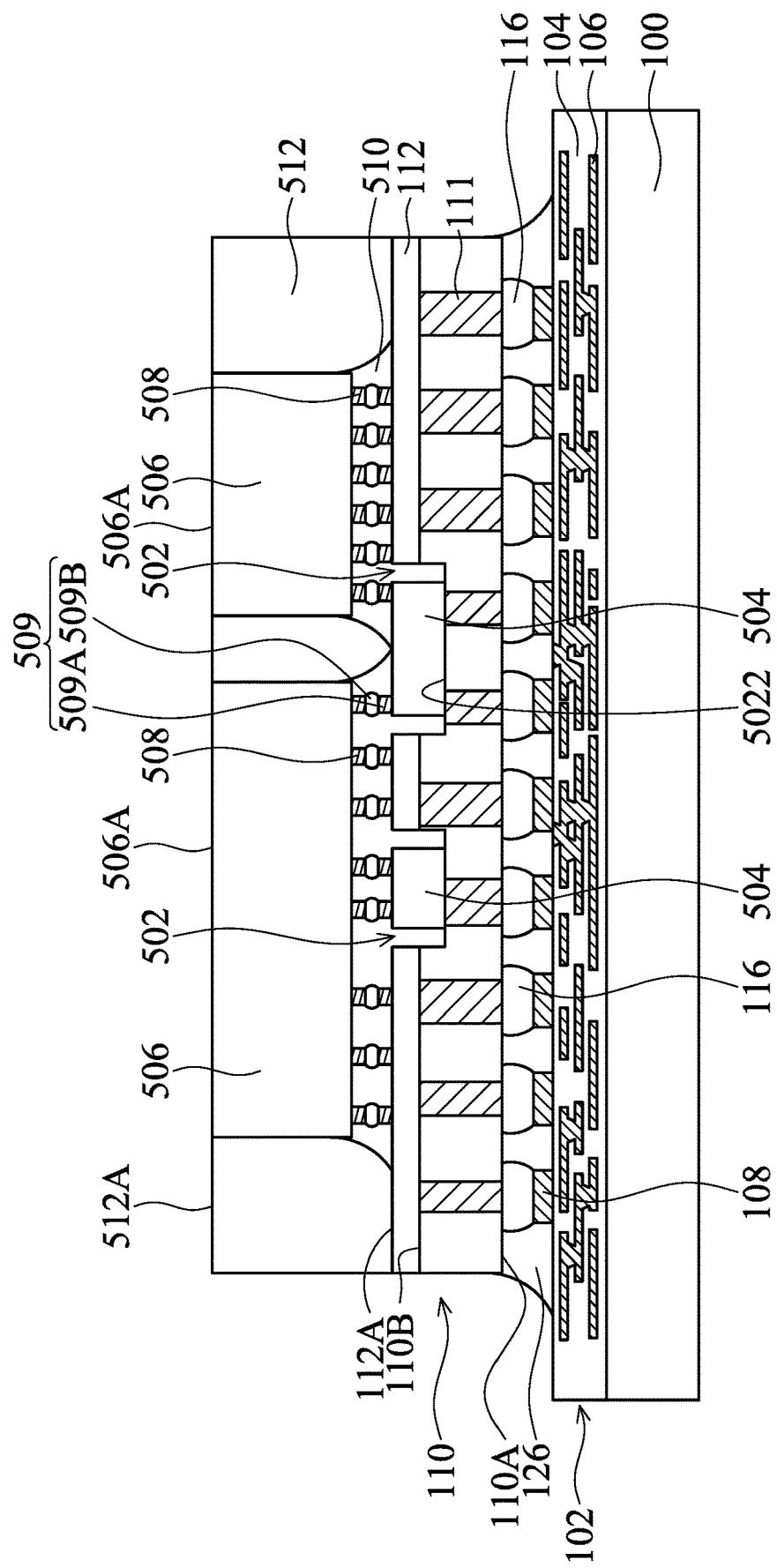

As shown in FIG. 4E, the resulting package structure in FIG. 4D is placed (by the pick-and-place tool) so that the first surface 110A of the interposer substrate 110 faces the package substrate 102, in accordance with some embodiments. Afterwards, the interposer substrate 110 (integrated with the semiconductor devices 504 and 506) is stacked over the package substrate 102 and then bonded onto the conductive elements 108 through conductive structures 116, similar to the previously discussed embodiments in FIG. 1F.

In some embodiments, the interposer substrate 110 and the package substrate 102 are pressed against each other at an elevated temperature. As a result, the interposer substrate 110 is bonded to the package substrate 102 through the conductive structures 116. In some embodiments, a thermal compression process is used to achieve the bonding process mentioned above. In some embodiments, an underfill element 126 is formed to surround and protect the conductive structures 116 and the conductive elements 108 between the interposer substrate 110 and the package substrate 102, similar to the previously discussed embodiments in FIG. 1F.

Figure 4F:
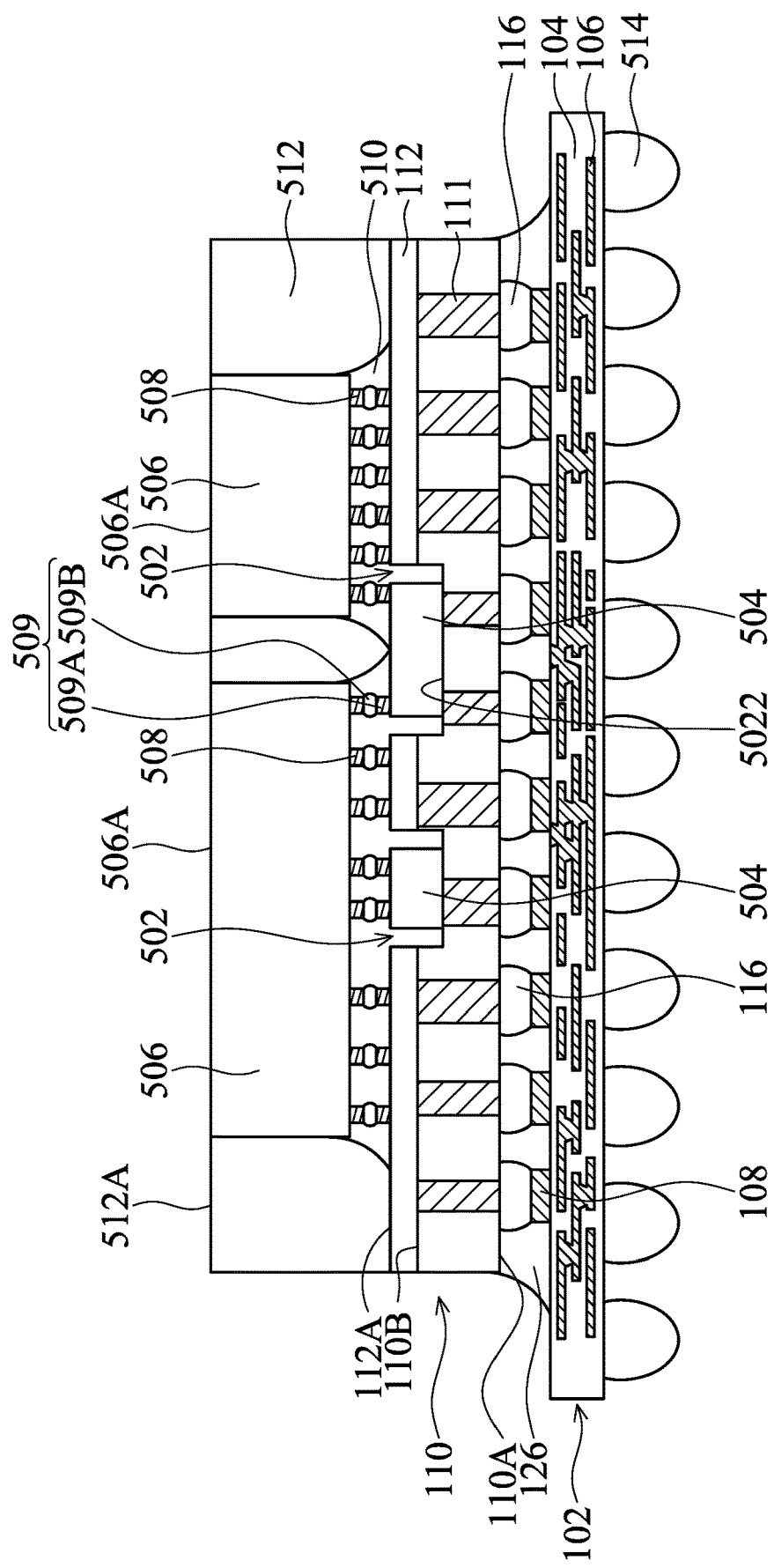

Afterwards, the carrier substrate 100 is removed to expose a surface of the package substrate 102, as shown in FIG. 4F, in accordance with some embodiments. In some embodiments, conductive bumps 514 are then formed over the surface of the package substrate 102 that is originally covered by the carrier substrate 100, as shown in FIG. 4F. Each conductive bump 514 may be electrically connected to one of the conductive features 106 of the package substrate 102. The conductive bumps 514 enable electrical connection between the package structure and an external device (not shown). The materials and formation method of the conductive bumps 514 may be the same or similar to those of the conductive bumps 136 illustrated in FIG. 1G.

As a result, the process for forming the resulting package structure illustrated in FIG. 4F, which includes a chip-on-wafer-on-substrate (CoWoS) package structure, is completed. In the package structure in FIG. 4F, the semiconductor devices 504 are received in the cavities 502 formed on the second surface 110B of the interposer substrate 110 facing and adjacent to the semiconductor devices 506. Each semiconductor device 504 may be directly interconnected to one or more semiconductor devices 506 (note that one of the semiconductor devices 504 may be a bridge device for bridging two or more semiconductor devices 506). Accordingly, the RC delay and/or signal noise are significantly reduced, and the signal transmission speed is improved. Consequently, the electrical performance of the overall package structure is improved. Further, a smaller overall package size can also be achieved due to the cavities 502 of the interposer substrate 110 for reasons similar to the cavities 118 (see FIG. 1D) described above.

Figure 5:
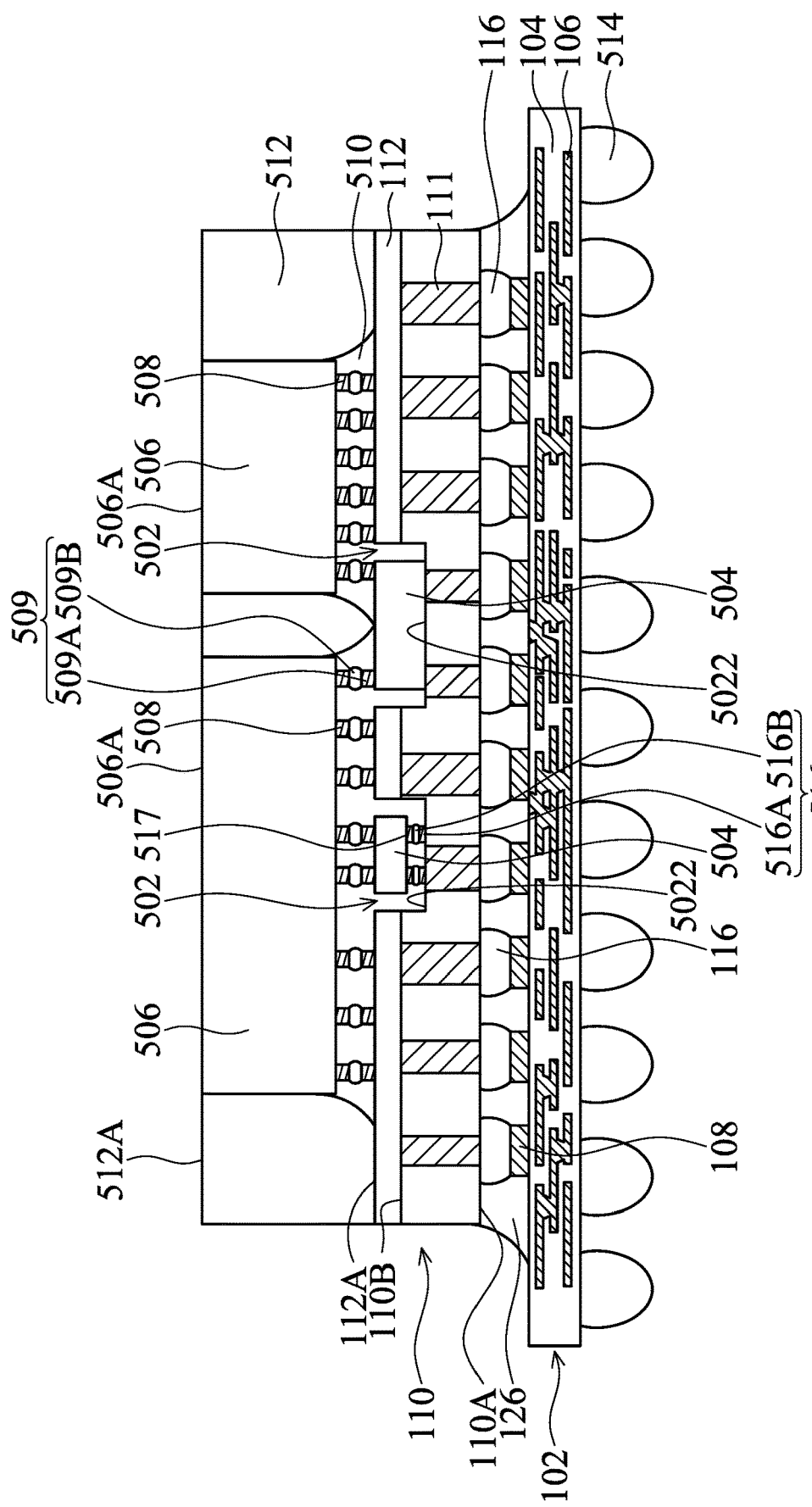
FIG. 5 is a cross-sectional view of a package structure, in accordance with some embodiments.

Many variations and/or modifications can be made to embodiments of the disclosure. FIG. 5 is a cross-sectional view of a package structure, in accordance with some embodiments. In some embodiments, one or more semiconductor devices 504 received in the cavities 502 of the interposer substrate 110 is electrically connected not only to the semiconductor device(s) 506 over the interposer substrate 110 but also to the interposer substrate 110 directly. For example, as shown in FIG. 5, one semiconductor device 504 received in one cavity 502 (e.g., the left cavity 502 shown in the figure) is further bonded onto the interposer substrate 110 (for example, electrically connected to some internal through-vias 111) through flip-chip bonding by way of the conductive structures 516 (each including a metal pillar 516A and a metal cap layer 516B over the metal pillar 516A) formed on the bottom surface 5022 of the cavity 502 and the conductive elements 517 (such as conductive pillars) on the semiconductor device 504 to form conductive joints, in accordance with some embodiments. The bonding between the semiconductor devices 504 and the interposer substrate 110 may be solder bonding or direct metal-to-metal (such as a copper-to-copper) bonding in some embodiments. The materials and formation methods of the conductive structures 516 and the conductive elements 517 may be the same or similar to those of the conductive structures 509 and the conductive elements 508, respectively, illustrated in FIG. 4D. In some embodiments, the semiconductor device 504 is placed in the cavity 502 and then bonded onto the interposer substrate 110 through the conductive joints (conductive structures 516 and the conductive elements 517) between the semiconductor device 504 and the bottom surface 5022 of the cavity 502 in the processing step illustrated in FIG. 4C as previously discussed, before the semiconductor devices 506 are stacked over the interposer substrate 110. The semiconductor device 504 of this embodiments may have a similar structure to the semiconductor device 120 in the previously discussed embodiments of FIG. 3.

As shown in FIG. 5, the semiconductor device 504 received in the cavity 502 is electrically connected to a semiconductor device 506 stacked over the interposer substrate 110 and the interposer substrate 110 itself at the same time. Accordingly, the electrical performance of the overall package structure is further improved.

In some other embodiments, one or more semiconductor devices 504 received in the interposer substrate cavities 502 may be electrically connected to the interposer substrate 110 only (i.e., not directly electrically connected to the semiconductor device(s) 506 over the interposer substrate 110). This can achieve the same effect as the embodiments of the package structure shown in FIGS. 1 to 2.

Many variations and/or modifications can be made to embodiments of the disclosure. For example, there may also be cavities formed on both the first and second surfaces 110A and 110B of the interposer substrate 110 (e.g., by combining the embodiments described above) to receive or accommodate additional semiconductor devices, in some other embodiments. Additionally or alternatively, the semiconductor devices received in the interposer substrate cavities may also be electrically connected to the package substrate 102, the interposer substrate 110, and/or the semiconductor devices over the interposer substrate 110.

Embodiments of the disclosure form a package structure including a package substrate, an interposer substrate over the package substrate, and multiple semiconductor devices over the interposer substrate. The interposer substrate also has one or more cavities to receive or accommodate additional semiconductor devices that are not allowed to be mounted on the surface of the interposer substrate. The cavities enable a thinner overall package structure. Some semiconductor devices received in the interposer substrate cavities may also be electrically connected to the interposer substrate and/or the semiconductor devices over the interposer substrate in order to improve the electrical performance of the overall package structure.

In accordance with some embodiments, a package structure is provided. The package structure includes a package substrate, an interposer substrate, a first semiconductor device, and a second semiconductor device. The interposer substrate is disposed over the package substrate and includes a silicon substrate. The interposer substrate has a bottom surface facing and adjacent to the package substrate, a top surface opposite the bottom surface, and a cavity formed on the top surface. The first semiconductor device is disposed on the top surface of the interposer substrate. The second semiconductor device is received in the cavity and electrically connected to the first semiconductor device and/or the interposer substrate.

In accordance with some embodiments, a method for forming a package structure is provided. The method includes providing an interposer substrate, wherein the interposer substrate includes a silicon substrate, and wherein the interposer substrate has a bottom surface and a top surface opposite the bottom surface. The method also includes forming a cavity on the top surface of the interposer substrate, wherein the depth of the cavity is less than the thickness of the interposer substrate. The method also includes stacking the interposer substrate over a package substrate. The method also includes disposing a first semiconductor device on the top surface of the interposer substrate. In addition, the method includes disposing a second semiconductor device in the cavity of the interposer substrate and on the bottom surface of the cavity.

In accordance with some embodiments, a package structure is provided. The package structure includes a package substrate, an interposer substrate, a first semiconductor device, and a second semiconductor device. The interposer substrate is disposed over the package substrate and includes a silicon substrate. The interposer substrate has a bottom surface facing and adjacent to the package substrate, a top surface opposite the bottom surface, and a cavity formed on the top surface. The first semiconductor device is disposed on the top surface of the interposer substrate. The second semiconductor device is received in the cavity and electrically connected to the first semiconductor device through a plurality of conductive joints between the second semiconductor device and the first semiconductor device. The top surface of the second semiconductor device is substantially flush with the top surface of the interposer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a package substrate;
an interposer substrate disposed over the package substrate, wherein the interposer substrate includes a silicon substrate, and wherein the interposer substrate has a bottom surface facing and adjacent to the package substrate, a top surface opposite the bottom surface, a first cavity formed on the top surface, and a second cavity formed on the bottom surface;
a first semiconductor device disposed on the top surface of the interposer substrate;
a second semiconductor device disposed in the first cavity and electrically connected to the first semiconductor device and/or the interposer substrate; and
a third semiconductor device disposed in the second cavity,
wherein the package substrate has a top surface facing and adjacent to the interposer substrate, and a third cavity is formed on the top surface of the package substrate and aligned with the second cavity of the interposer substrate, wherein the third cavity is configured to accommodate the third semiconductor device.

2. The package structure as claimed in claim 1, wherein the second semiconductor device is electrically connected to the first semiconductor device through a plurality of first conductive joints between the first semiconductor device and the second semiconductor device.

3. The package structure as claimed in claim 2, wherein the second semiconductor device is electrically isolated from the interposer.

4. The package structure as claimed in claim 1, wherein the second semiconductor device is electrically connected to the interposer substrate through a plurality of second conductive joints between the second semiconductor device and a bottom surface of the first cavity.

5. The package structure as claimed in claim 1, wherein the second semiconductor device is electrically connected to the first semiconductor device through a plurality of first conductive joints between the first semiconductor device and the second semiconductor device, and is also electrically connected to the interposer substrate through a plurality of second conductive joints between the second semiconductor device and a bottom surface of the first cavity.

6. The package structure as claimed in claim 1, further comprising a fourth semiconductor device disposed on the top surface of the interposer substrate, and wherein the second semiconductor device is electrically connected to the first semiconductor device through a plurality of first conductive joints between the first semiconductor device and the second semiconductor device and is also electrically connected to the fourth semiconductor device through a plurality of second conductive joints between the fourth semiconductor device and the second semiconductor device.

7. The package structure as claimed in claim 6, wherein the second semiconductor and the first cavity are located between and below the first semiconductor device and the fourth semiconductor device.

8. The package structure as claimed in claim 7, wherein the second semiconductor is a bridge device and configured to bridge the first semiconductor device and the fourth semiconductor device.

9. The package structure as claimed in claim 1, wherein a depth of the first cavity is less than a thickness of the interposer substrate.

10. The package structure as claimed in claim 1, wherein the first semiconductor device and the second semiconductor device include different types of electronic devices.

11. A method for forming a package structure, the method comprising:
providing an interposer substrate, wherein the interposer substrate includes a silicon substrate, and wherein the interposer substrate has a bottom surface and a top surface opposite the bottom surface;

forming a first cavity on the top surface of the interposer substrate and a second cavity on the bottom surface of the interposer substrate, wherein a depth of the first cavity and a depth of the second cavity is less than a thickness of the interposer substrate;

disposing a first semiconductor device on the top surface of the interposer substrate;

disposing a second semiconductor device in the first cavity of the interposer substrate and on a bottom surface of the first cavity;

disposing a third semiconductor device in the second cavity of the interposer substrate and on a bottom surface of the second cavity;

forming a third cavity on a top surface of a package substrate; and stacking the interposer substrate over the package substrate such that the bottom surface of the interposer substrate faces the top surface of the package substrate and the third semiconductor device is disposed in the third cavity.

12. The method as claimed in claim 11, wherein after disposing the second semiconductor device in the first cavity, the method further comprises electrically connecting the second semiconductor device to the interposer substrate through a plurality of conductive joints between the second semiconductor device and the bottom surface of the first cavity.

13. The method as claimed in claim 11, wherein after disposing the second semiconductor device in the first cavity, the method further comprises electrically connecting first semiconductor device to the second semiconductor device through a plurality of conductive joints between the first semiconductor device and the second semiconductor device.

14. The method as claimed in claim 13, wherein after disposing the second semiconductor device in the first cavity, the method further comprises disposing a fourth semiconductor device on the top surface of the interposer substrate, and electrically connecting fourth semiconductor device to the second semiconductor device through a plurality of conductive joints between the fourth semiconductor device and the second semiconductor device.

15. The method as claimed in claim 14, wherein the second semiconductor device is a bridge device and configured to bridge the first semiconductor device and the fourth semiconductor device.

16. A package structure, comprising:

a package substrate;

an interposer substrate disposed over the package substrate, wherein the interposer substrate includes a silicon substrate, and wherein the interposer substrate has a bottom surface facing and adjacent to the package substrate, a top surface opposite the bottom surface, a first cavity formed on the top surface, and a second cavity formed on the bottom surface;

a first semiconductor device disposed on the top surface of the interposer substrate;

a second semiconductor device disposed in the first cavity and electrically connected to the first semiconductor device through a plurality of conductive joints between the second semiconductor device and the first semiconductor device, wherein a top surface of the second semiconductor device is substantially flush with the top surface of the interposer substrate; and a third semiconductor device disposed in the second cavity, wherein the package substrate has a top surface facing and adjacent to the interposer substrate, and a third cavity is formed on the top surface of the package substrate and aligned with the second cavity of the interposer substrate, wherein the third semiconductor device extends into the third cavity of the package substrate.

17. The package structure as claimed in claim 16, wherein the second semiconductor device is electrically isolated from the interposer.

18. The package structure as claimed in claim 16, wherein the second semiconductor device is electrically connected to the interposer substrate through a plurality of second conductive joints between the second semiconductor device and a bottom surface of the first cavity.

19. The package structure as claimed in claim 16, wherein at least a portion of the first cavity is located below the first semiconductor device.

20. The package structure as claimed in claim 16, wherein the third semiconductor device is further electrically connected to the package substrate via a plurality of second conductive joints between the third semiconductor device and a bottom surface of the third cavity of the package substrate.

* * * * *